(12) United States Patent
Qiu et al.

(10) Patent No.: US 7,923,924 B2
(45) Date of Patent: Apr. 12, 2011

(54) ORGANIC ELECTROLUMINESCENT DISPLAY/SOURCE WITH ANODE AND CATHODE LEADS

(75) Inventors: Yong Qiu, Beijing (CN); Shenfu Zhang, Beijing (CN); Guohui Zhang, Beijing (CN); Kongwu Wu, Beijing (CN); Yudi Gao, Kunshan (CN)

(73) Assignees: Tsinghua University, Beijing (CN); Beijing Visionox Technology Co., Ltd., Beijing (CN); Kunshan Visionox Technology Co., Ltd., Kunshan, Jiangsu Province (CN)

(*) Notice: Subject to any disclaimer, the term of this patent is extended or adjusted under 35 U.S.C. 154(b) by 207 days.

(21) Appl. No.: 12/061,441

(22) Filed: Apr. 2, 2008

(65) Prior Publication Data
US 2008/0246393 A1 Oct. 9, 2008

(30) Foreign Application Priority Data

Apr. 3, 2007 (CN) .......................... 2007 1 0065097
Apr. 28, 2007 (CN) .......................... 2007 1 0098872

(51) Int. Cl.
*H01J 1/62* (2006.01)
*H01J 63/04* (2006.01)
*G09G 3/30* (2006.01)

(52) U.S. Cl. ...... 313/504; 313/507; 313/512; 315/169.4
(58) Field of Classification Search .......................... None
See application file for complete search history.

(56) References Cited

U.S. PATENT DOCUMENTS

| 2002/0017859 A1* | 2/2002 | Ishikawa et al. ............... 313/504 |
| 2003/0080678 A1* | 5/2003 | Kim et al. ...................... 313/504 |
| 2004/0056587 A1* | 3/2004 | Kim ............................... 313/500 |
| 2005/0200798 A1* | 9/2005 | Tanaka .......................... 349/155 |
| 2007/0132376 A1* | 6/2007 | Heo ............................... 313/505 |

FOREIGN PATENT DOCUMENTS

| CN | 1674738 A | 9/2005 |
| CN | 1822731 A | 8/2006 |
| CN | 1874624 A | 12/2006 |
| JP | 9219288 A | 8/1997 |
| JP | 11224774 A | 8/1999 |
| JP | 11233255 A | 8/1999 |
| JP | 2000-58271 A | 2/2000 |
| JP | 2000215982 A | 8/2000 |
| JP | 2001267065 A | 9/2001 |
| JP | 2003332043 A | 11/2003 |
| JP | 2003332044 A | 11/2003 |
| JP | 2003332048 A | 11/2003 |
| JP | 2003332049 A | 11/2003 |
| JP | 2004253303 A | 9/2004 |
| JP | 2008186618 A | 8/2008 |
| WO | WO 03/034513 A1 | 4/2003 |

* cited by examiner

*Primary Examiner* — Peter J Macchiarolo
*Assistant Examiner* — Tracie Green
(74) *Attorney, Agent, or Firm* — Ladas & Parry, LLP

(57) ABSTRACT

The present invention relates to an organic electroluminescent display, including a substrate, a set of anodes, an organic functional layer, a set of cathodes and a packaging sheet, wherein a set of electrode leads are disposed on the packaging sheet for electrical connection with a control circuit of the display, and the electrode leads includes a set of anode leads and a set of cathode leads which are electrically connected with the corresponding anodes and cathodes on the substrate, respectively. The present invention further relates to a double-sided organic electroluminescent display having the above features.

18 Claims, 8 Drawing Sheets

-- Prior Art --

-- Prior Art --

ORGANIC ELECTROLUMINESCENT DISPLAY/SOURCE WITH ANODE AND CATHODE LEADS

CROSS-REFERENCE TO RELATED APPLICATIONS

This application claims priority from Chinese Application No. 200710065097.4, filed on Apr. 3, 2007, entitled "Organic Luminous Display," and Chinese Application No. 200710098872.6, filed on Apr. 28, 2007, entitled "Electroluminescent Light Source," the contents which are incorporated herein by reference in their entirety.

FIELD OF THE INVENTION

The present invention pertains to organic electroluminescent field, especially relates to an organic electroluminescent display and to an organic electroluminescent light source.

BACKGROUND OF THE INVENTION

Organic electroluminescent devices have a lot of excellent properties such as self-luminescence, high-brightness, broad view angle, high contrast, low energy consumption, rapid response, broad range of operation temperature, high luminescent efficiency, simple process for manufacture, and so on, so that they arrest many attentions around the world.

Currently, electrode leads of an organic electroluminescent device are usually made on an electroluminescent substrate, whatever the electrode leads are disposed at one side, two sides or four sides of the substrate, so that the frame size of display module increases and the luminescent area is reduced, and this problem become more serious with the increase of pixel number, as shown in FIG. 1. FIG. 2 is a structural schematic view for bonding and packaging an organic electroluminescent device in the prior art, in which a lead region 22 surrounds a substrate 21, an organic electroluminescent device is packaged between a packaging sheet 23 and the substrate 21 by using a packaging adhesive, the packaging sheet usually has an area less than the area of the substrate, a packaging region 24 and a light emitting region 25 are also presented, and it can be seen from FIG. 2 that the area of light emitting region of such a conventional organic electroluminescent device is significantly reduced due to the existence of the lead region.

In a double-sided organic electroluminescent device module of the art, the bonding of leads is also performed on substrate, a packaging sheet is sandwiched between two light-emitting components for packaging, supporting drying and heat dispersion, so that such a device has a relatively large volume and a relatively broad frame after bonding, and is difficult in cutting procedure. For example, China Patent Application Series No. 200510048837.4, published on Aug. 23, 2006 discloses a double-sided organic electroluminescent device in which a supporter is disposed between two electroluminescent components, the supporter is used to package the device, and a moisture absorption layer is disposed on the supporter for absorbing moisture in the packaged structure. Another China Patent Application Series No. 200610082800.8, published on Dec. 6, 2006 discloses a double-sided electroluminescent display, in which a packaging adhesive is disposed between two electroluminescent components to package the double-sided electroluminescent display and absorb moisture. Another China Patent Application Series No. 200510069655.5, published on Sep. 28, 2005, discloses a double-sided electroluminescent display, in which the thickness of the whole double-sided electroluminescent display is reduced to elevate the degree of airproof and to simultaneously reduce the difficulty in connecting the double-sided electroluminescent display with a control circuit, but the bonding of leads is still performed on the substrate.

In addition, there are two main structures for organic electroluminescent light sources nowadays, as shown in FIG. 3(a) and FIG. 3(b), in which FIG. 3(a) shows a light source with bonding at one side, comprising a substrate plate 31, a luminescent region 32, a lead bonding region 33, a cathode lead region 34, and an anode lead region 35. This structure had the following three drawbacks:

1) Uniformity of luminescence is poor: For example, as for points C and D in the luminescent region 32, since the point C is further from the lead bonding region 33 than the point D, the electric resistance from the bonding region 33 to the point C is greater than that to the point D, so that the electric current density at the point C is less than that at the point D during working, and the brightness at the point C is lower than that at the point D, i.e., the luminescence of the device is not uniform. In the meantime, the commonly used auxiliary electrodes are of metal Cr, while Cr layer has a relatively high surface resistance, so that it is difficult to effectively eliminate the non-uniformity of luminescence caused by such difference of electric current density.

2) The frame of the light source is large and the proportion of effective luminescent area to substrate area is relatively small. Since electrode leads 34 and 35 of organic electroluminescent light source are made on the substrate 31, the leads occupy a certain area of the substrate so that the effective luminescent area 32 is reduced, as shown in FIG. 3(a).

3) Life of the light source is short. Currently, the bonding and packaging are usually performed on the substrate. For example, as for the bonding region 33 in FIG. 3(a), most of the electrode leads 34 and 35 are exposed to environmental air, so they may be destroyed by external force or corrosive atmosphere, and thus the life of device is influenced adversely.

FIG. 3(b) shows a structure of another light source having double-sided bonding, which comprises a substrate 36, a luminescent region 37, a bonding region 38, a cathode lead region 39, an anode lead region 40. Since the structure is formed by employing double-sided bonding, the electric currents at points E and F in the luminescent region 37 separately flow to the adjacent bonding region 38, the current direction is different from that of single-sided bonding in which current flows to one direction, so that the difference of current density at different points in the luminescent region can be reduced and the luminescent uniformity is significantly improved in comparison with that in FIG. 3(a), but the use of metal Cr auxiliary electrodes still influence the luminescent uniformity.

Due to the use of double-sided bonding, the manufacture process is complex, which may limit the application of such light source. In addition, the aforementioned drawbacks 2) and 3) are not sufficiently overcome.

SUMMARY OF THE INVENTION

According to one aspect of the present invention, there is provided an organic electroluminescent display, comprising a substrate, a set of anodes, an organic functional layer, a set of cathodes and a packaging sheet, wherein a set of electrode leads are disposed on the packaging sheet for electrical connection with a control circuit of the display, and the electrode leads comprise a set of anode leads and a set of cathode leads which are electrically connected with the corresponding anodes and cathodes on the substrate, respectively.

In some embodiments of the present invention, an electrode lead transferring region is arranged on the substrate, and the anode leads and the cathode leads on the packaging sheet are electrically connected with the anodes and cathodes in the electrode lead transferring region, respectively.

In some embodiments of the present invention, an electric connection between the anodes and the anode leads and an electric connection between the cathodes and the cathode leads are respectively established through a set of electrically conductive media between the substrate and the packaging sheet.

In some embodiments of the present invention, an electrode lead bonding region is arranged at one end of the packaging sheet, and the control circuit of the display is electrically connected with electrode leads in the electrode lead bonding region.

According to another aspect of the present invention, there is provided a double-sided organic electroluminescent display, comprising a first display device, a second display device and a packaging sheet sandwiched between the first display device and the second display device, in which the first display device comprises a first substrate, a first set of anodes, a first organic functional layer and a first set of cathodes, the second display device comprises a second substrate, a second set of anodes, a second organic functional layer and a second set of cathodes, and the packaging sheet as a support for the first display device and the second display device is located between the first set of cathodes and the second set of cathodes, wherein a first set of electrode leads is disposed on a first surface of the packaging sheet for electrical connection with a control circuit of the first display device, and the first set of electrode leads comprises a first set of anode leads and a first set of cathode leads which are electrically connected with the first set of anodes and the first set of cathodes on the first substrate, respectively; and wherein a second set of electrode leads are disposed on a second surface of the packaging sheet for electrical connection with a control circuit of the second display device, and the second set of electrode leads comprises a second set of anode leads and a second set of cathode leads which are electrically connected with the second set of anodes and the second set of cathodes on the second substrate, respectively.

In some embodiments of the double-sided organic electroluminescent display according to the present invention, a first electrode lead transferring region and a second electrode lead transferring region are respectively arranged on the first substrate and the second substrate, the first set of anode leads and the first set of cathode leads on the first surface of the packaging sheet are electrically connected with the first set of anodes and the first set of cathodes in the first electrode lead transferring region, respectively; and the second set of anode leads and the second set of cathode leads on the second surface of the packaging sheet are electrically connected with the second set of anodes and the second set of cathodes in the second electrode lead transferring region, respectively.

In some embodiments of the double-sided organic electroluminescent display according to the present invention, an electric connection between corresponding anodes and anode leads and an electric connection between corresponding cathodes and cathode leads are respectively established through a set of electrically conductive media between the first substrate and the first surface of the packaging sheet as well as a set of electrically conductive media between the second substrate and the second surface of the packaging sheet.

In some embodiments of the double-sided organic electroluminescent display according to the present invention, a first electrode lead bonding region is arranged at one end of the first surface of the packaging sheet, and the control circuit of the first display device is electrically connected with the electrode leads in the first electrode lead bonding region; and a second electrode lead bonding region is arranged at one end of the second surface of the packaging sheet, and the control circuit of the second display device is electrically connected with the electrode leads in the second electrode lead bonding region.

According to further another aspect of the present invention, there is provided an organic electroluminescent light source, comprising a substrate, a set of anodes, an organic functional layer, a set of cathodes and a packaging sheet, wherein a set of electrode leads are disposed on the packaging sheet for electrical connection with a control circuit of the light source, and the electrode leads comprise a set of anode leads and a set of cathode leads which are electrically connected with the corresponding anodes and cathodes on the substrate, respectively.

In some embodiments of the organic electroluminescent light source according to the present invention, the anode leads are symmetrically disposed at two ends of the packaging sheet, and the cathode leads are symmetrically disposed at another two ends of the packaging sheet.

In some embodiments of the organic electroluminescent light source according to the present invention, the anode leads and the cathode leads are continuous metal layers formed respectively by vapor deposition on the packaging sheet.

In some embodiments of the organic electroluminescent light source according to the present invention, both the continuous metal layers as the anode leads and the continuous metal layers as the cathode leads are of symmetrical strip shape.

In some embodiments of the organic electroluminescent light source according to the present invention, an electrical connection between the symmetrically disposed anode leads are established though metal layers of strip shape.

In some embodiments of the organic electroluminescent light source according to the present invention, an insulating layer is formed by vapor deposition on the metal layers of strip shape between the anode leads in order to avoid electric contact of the metal layers with the cathodes after the packaging sheet is bonded to the cathodes.

According further another aspect of the present invention, there is provided a double-sided organic electroluminescent light source, comprising a first light source, a second light source and a packaging sheet sandwiched between the first light source and the second light source, in which the first light source comprises a first substrate, a first set of anodes, a first organic functional layer and a first set of cathodes, the second light source comprises a second substrate, a second set of anodes, a second organic functional layer and a second set of cathodes, and the packaging sheet as a support for the first light source and the second light source is located between the first set of cathodes and the second set of cathodes, wherein a first set of anode leads and a first set of cathode leads are disposed on a first surface of the packaging sheet for electrical connection with a control circuit of the first light source device, the first set of anode leads are electrically connected with the first set of anodes, and the first set of cathode leads are electrically connected with the first set of cathodes; and a second set of anode leads and a second set of cathode leads are disposed on a second surface of the packaging sheet for electrical connection with a control circuit of the second light source device, the second set of anode leads are electrically connected with the second set of anodes, and the second set of cathode leads are electrically connected with the second set of cathodes.

In some embodiments of the double-sided organic electroluminescent light source according to the present invention, the first anode leads are symmetrically disposed at two ends of the first surface of the packaging sheet, and the first cathode leads are symmetrically disposed at another two ends of the first surface of the packaging sheet; and the second anode leads are symmetrically disposed at two ends of the second surface of the packaging sheet, and the second cathode leads are symmetrically disposed at another two ends of the second surface of the packaging sheet.

In some embodiments of the double-sided organic electroluminescent light source according to the present invention, the first and second sets of anode leads and the first and second sets of cathode leads are continuous metal layers formed by vapor deposition on the first and second surfaces of the packaging sheet, respectively.

In some embodiments of the double-sided organic electroluminescent light source according to the present invention, both the continuous metal layers as the first and second sets of anode leads and the continuous metal layers as the first and second sets of cathode leads are of symmetrical strip shape.

In some embodiments of the double-sided organic electroluminescent light source according to the present invention, an electrical connection between the symmetrically disposed first set of anode leads is established though metal layers of strip shape; and an electrical connection between the symmetrically disposed second set of anode leads are established though metal layers of strip shape.

In some embodiments of the double-sided organic electroluminescent light source according to the present invention, an insulating layer is formed by vapor deposition on the metal layers of strip shape between the first set of anode leads and an insulating layer is formed by vapor deposition on the metal layers of strip shape between the second set of anode leads in order to avoid the electric contact of the metal layers with the first and second sets of cathodes after the packaging sheet is bonded to the first and second sets of cathodes.

Without being limited with any theory, it can be believed that in some embodiments of the present invention, since the leads are transferred to the packaging sheet and bonded at the end of the packaging sheet, the area of luminescent region may not be influenced by the leads, so that the size of bonding frame can be reduced, the luminescent region is enlarged. In some embodiments, since electrode leads are sealed in the device, they are protected from effects of air, water and oxygen. As for some embodiments of the double-sided electroluminescent device, the packaging sheet as supporter not only provides a space for drying agent and heat dissipation, but also provides bonding regions for leads of luminescent components. In addition, some embodiments of the present invention can be implemented by a simple manufacture process, and since leads region and bonding region are disposed on packaging sheet, the length of leads may be shortened to reduce resistance of leads.

In some embodiments of the organic electroluminescent light source according to the present invention, leads are transferred from a substrate to a packaging sheet, and anode leads are disposed at two ends of the packaging sheet, so that the resistance difference of leads is reduced. In some embodiments, electrode leads are internally sealed in the device, and relatively active metal silver or aluminum with lower resistance is used as auxiliary electrodes to replace conventional metal Cr auxiliary electrodes, so that the resistance difference is further reduced, the non-uniformity of luminescence of large-area light source is significantly reduced, the size of frame for leads is effectively reduced, the life of device is prolonged and the operation is simple and convenient.

BRIEF DESCRIPTION OF THE DRAWINGS

FIG. 6(a) to FIG. 6(g) show schematic diagrams and structural section diagrams of a procedure for manufacturing the organic electroluminescent light source of Light Source Example 1 of the present invention, in which FIG. 6(a) is a schematic diagram for making anodes on substrate; FIG. 6(b) is a schematic diagram for making an organic functional layer by vapor deposition; FIG. 6(c) is a schematic diagram for making cathodes; FIG. 6(d) is a schematic diagram for making electrode leads on packaging sheet; FIG. 6(e) is a schematic diagram for coating an electric conduction adhesive on electrode leads; FIG. 6(f) is a schematic diagram for coating a packaging adhesive on packaging sheet; and FIG. 6(g) is a structural section diagram of light source.

DESCRIPTION OF THE PREFERRED EMBODIMENTS

The present invention are further illustrated in conjugation with the drawings and examples, but it is understood that these drawings and examples are merely illustrative and are not used to limit the present invention.

EXAMPLE 1

Figure 1:
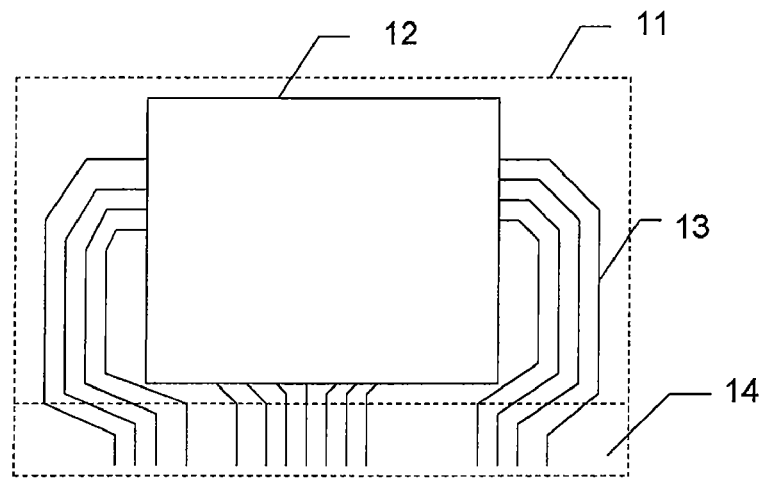
FIG. 1 is a structure diagram of a conventional organic electroluminescent display in which electrode leads and a bonding region for leads are disposed on a substrate.
Figure 2:
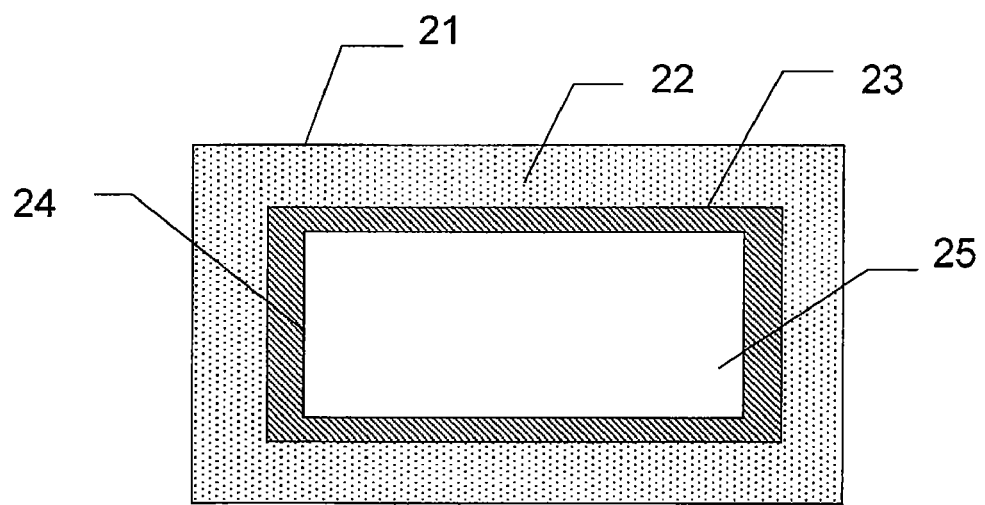
FIG. 2 is a schematic diagram of relationship of a leads region, a packaging region and a luminescent region in a conventional organic electroluminescent display.
Figure 3A:
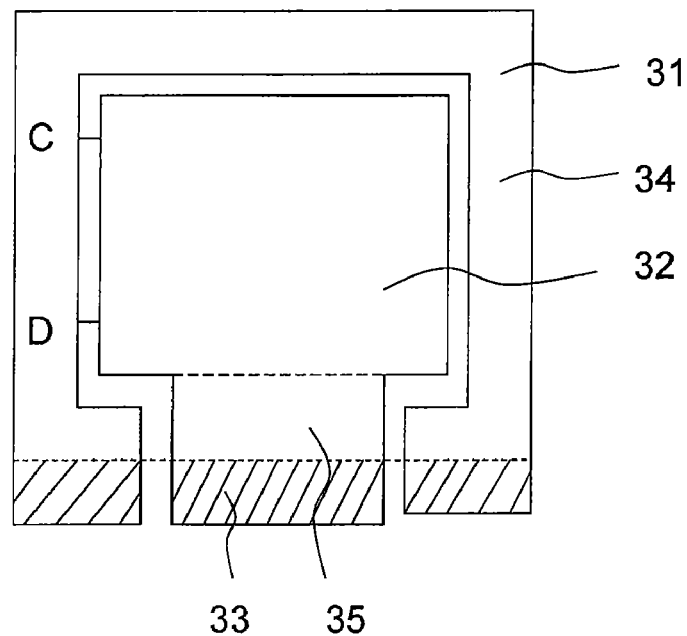
FIG. 3(a) is a schematic diagram of single-sided bonding in a conventional organic electroluminescent light source.
Figure 3B:
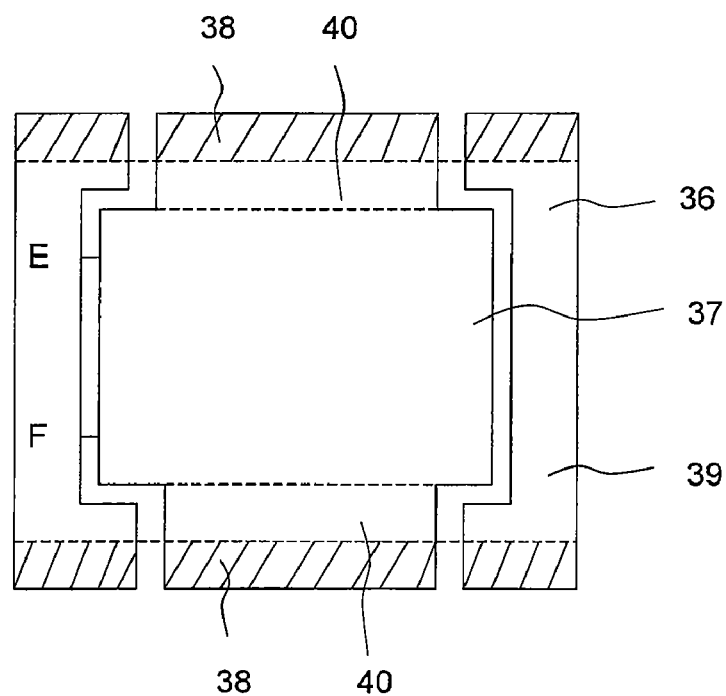
FIG. 3(b) is a schematic diagram of double-sided bonding in a conventional organic electroluminescent light source.
Figure 4A:
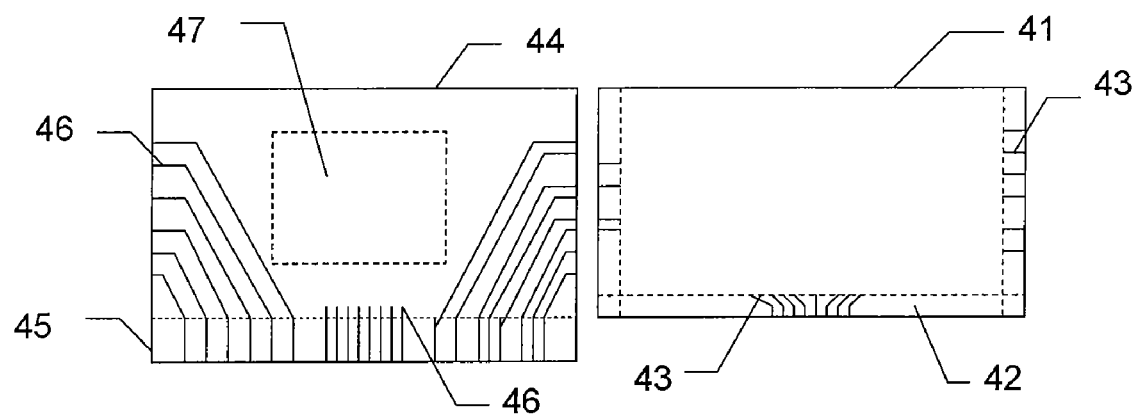
FIG. 4(a) is a schematic structural diagram of a packaging sheet and a substrate of the organic electroluminescent display of Display Example 1 of the present invention.
Figure 4B:
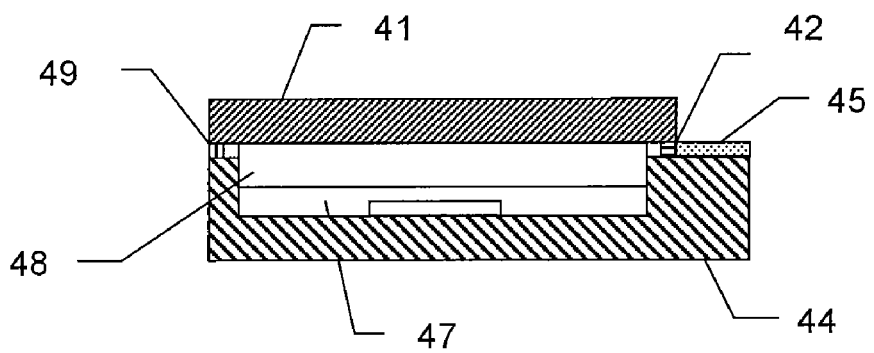
FIG. 4(b) is a structural section diagram of the organic electroluminescent display of Display Example 1 of the present invention.

Turning to FIG. 4(b), it is a structural section diagram of the organic electroluminescent display of Display Example 1, in which the display comprises a substrate 41, an organic electroluminescent device 48, a packaging sheet 44, a packaging region 49, a packaging region and electrode transferring region 42, a bonding region 45, a drying region 47, and in which the organic electroluminescent device 48 is disposed on the substrate 41, the packaging sheet 44 is disposed on the organic electroluminescent device 48, the packaging sheet 44 is connected with the substrate 41 through a packaging adhesive in order to package the device, and a recess is provided in the middle part of the packaging sheet 44 for placing a drying agent. In addition, from the section diagram of the organic electroluminescent device as shown in FIG. 4(b), it can be seen that the packaging region 49, the packaging region and electrode transferring region 42 and bonding region 45 are disposed on the surface of the packaging sheet 44 adjacent to the substrate 41. In addition, the organic electroluminescent device 48 comprises anodes, an organic functional layer, cathodes disposed in order on the substrate 41, in which the organic functional layer further comprises one or more of hole injection layer, hole transport layer, electron transport layer and electron injection layer (not shown).

FIG. 4(a) is a structural diagram of the packaging sheet and structure of the organic electroluminescent display of Display Example 1, in which leads region 46 and bonding region 45 are disposed on the packaging sheet 44, the area of the packaging sheet 44 is greater than the area of the substrate 41 (the exceeded area equals to the area of the bonding region 45), electrodes 43 including anodes and cathodes capable of joining to the electrode leads 46 of the packaging sheet 44 are disposed on the electrode transferring region 42 of the substrate 41, the positions of leads of the packaging sheet 44 correspond to the positions of electrodes of the substrate 41 one by one, and thus through their electric connection, the transfer of electrode leads from the substrate 41 to the packaging sheet 44 is achieved.

The organic electroluminescent display of Display Example 1 is manufactured by a method comprising: using transparent glass as a substrate, forming an anode layer (ITO), an organic functional layer and a cathode layer in order on the substrate, optionally forming auxiliary electrodes on ITO by vapor deposition to reduce resistance of leads, then making a packaging sheet by a material which can be selected from glass, plastic or quartz (glass plate is selected in the present example, which preferably has a thickness of 0.5~1.1 mm, and the dimension of glass plate is greater than that of the substrate), reserving a bonding region, making electrode leads on one surface of the glass plate by etching method. At one end of the packaging sheet, leads are gathered at one side as bonding region. A recess is formed at the middle part of surface of the packaging sheet by sandblasting or etching method for placing a drying agent. Then, the above made electroluminescent device is packaged by using the packaging sheet, in which the positions of electrodes of the substrate correspond to the positions of the electrode leads of the packaging sheet one by one, as shown by signs 43 and 46 in FIG. 4(a). At the end opposite to the bonding region of the packaging sheet, no leads is disposed (see FIG. 4(a)), and the end can be bonded to the substrate through a packaging adhesive as a packaging region 49 as shown in FIG. 4(b). The leads region of the packaging sheet may be closely joined to the substrate under certain pressure by adding conductive particles with a property of anisotropic anisotropic conduction into the packaging adhesive, so that the transfer of electrode leads is completed simultaneously during the packaging step, and the packaging region may also be overlapped with the electrode leads transferring region, as shown by sign 42 in FIG. 4(b), in which the conductive particles with property of anisotropic conduction can be prepared by a method comprising: plating a layer of metal, such as Ni, Au, Au on Ni, Ag or Sn-alloy, on the surface of a common plastic core, then coating a 10 nm-thickness of insulting layer on the metal layer, in which the insulating layer consists of very fine resin particles. The conductive particles are used to provide good electric connection between the electrodes of the substrate and the electrode leads of the packaging sheet in order to enhance the effect of wiring the electrodes. After the above preparation is completed, the packaging sheet is connected with a control circuit through the bonding region at one end of the packaging sheet, so that the display can be driven for normal working.

EXAMPLE 2

Figure 5:
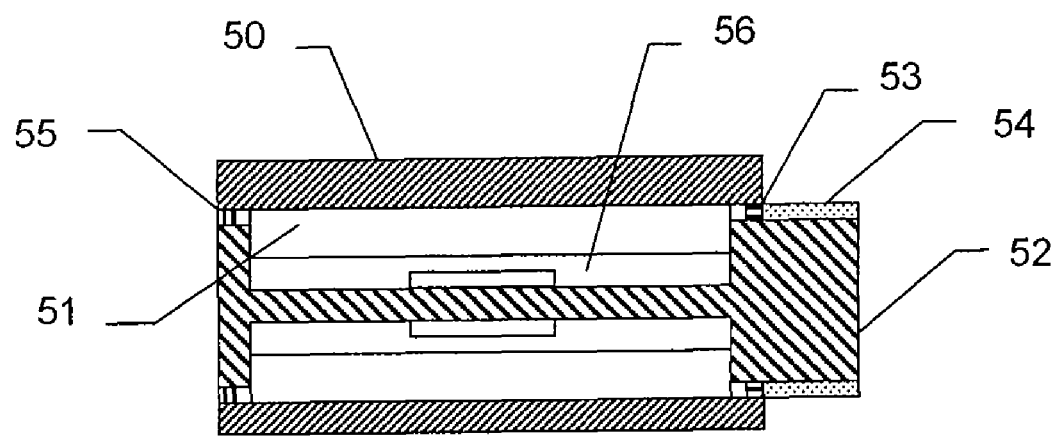
FIG. 5 is a structural section diagram of the organic electroluminescent display of Display Example 2 of the present invention, in which two surfaces are shown.

Turning to FIG. 5, it is a structural section diagram of two surfaces of the organic electroluminescent display of Display Example 2 of the present invention, in which the display comprises a first display device, a second device and a packaging sheet sandwiched between the first display device and the second display device, in which the first display device comprises a first substrate 50 and a first component 51, and correspondingly the second display also comprises a substrate and a second component, and the packaging sheet 52 is sandwiched between the two display devices and has two surfaces which separately are adjacent to the two display devices. The packaging sheet 52 is joined to the first substrate and the second substrate through a packaging adhesive, a recess is disposed at each of the two surfaces of the packaging sheet 52 for placing a drying agent. In addition, a packaging region 55, a packaging region and electrode leads transferring region 53 and bonding region 54 are also disposed on the surface of the packaging sheet 52 adjacent to the substrate 50 of the first display device. Similarly, packaging region, packaging region and electrode leads transferring region, and bonding region are also disposed on the surface of the packaging sheet adjacent to the second display device. Furthermore, the first and second electroluminescent components separately comprises anodes, an organic functional layer, cathodes disposed in order on substrate, in which the organic functional layer further comprises one or more of hole injection layer, hole transport layer, electron transport layer and electron injection layer (their specific structure are not shown in the structure diagram).

The structural diagram of the packaging sheet and structure of the double-sided organic electroluminescent display of Display Example 2 is similar to that in FIG. 4(a), and the basic design principle is also similar to that of Display Example 1. The differences are that the packaging sheet of the present example has electrode leads regions and bonding regions on both of its surfaces, and has recesses on both of its surfaces for placing drying agent, the two display devices use the same one packaging sheet, and the transfer of electrode leads is implemented during the packaging.

The method for making the double-sided organic electroluminescent display of Display Example 2 is similar to that of Display Example 1: firstly making the first electroluminescent display device and the second electroluminescent display device, then making the packaging sheet, and completing the packaging and the transfer of electrode leads, in which both first electroluminescent display device and the second electroluminescent display device are of bottom luminescent, use cathodes of nontransparent metal, such as metal aluminum, magnesium, silver, etc. Glass plate is selected for the packaging sheet and has a thickness of 0.5~1.1 mm, and electrode leads are etched on the two surfaces of the glass plate and gathered at one side as bonding region. For reducing the volume of whole device, both of two bonding regions are disposed at the same end of the packaging sheet, but they may also be disposed at different two ends of the packaging sheet. A recess is formed at middle part of each surface of the packaging sheet by sandblasting or etching method for placing drying agent; or a via connecting two surfaces of the packaging sheet is made for placing a dry agent for common use. The packaging sheet is joined to the substrate in a manner similar to that of Example 1, and the two surfaces of the packaging sheet are separately joined to the two substrates. After the preparation is completed, the bonding regions of the two surfaces of the packaging sheet are separately connected with two independent control circuits to drive the first and second electroluminescent device for normal working.

In the present example, besides the packaging sheet servers as a supporter for the two electroluminescent devices of the double-sided electroluminescent display, packages the devices, and provides spaces for drying agent and heart emission, there is a further important function of the packaging sheet to provide leads region and bonding region for leads in order to implement the circuit connection of the display. In the present example, the two electroluminescent devices share the same one packaging sheet, the operation is simple and convenient, the size of frame of the luminescent region is reduced, the luminescent area is extended, and the electrode leads are protected from effects of air, water and oxygen.

EXAMPLE 3

The present example relates to an organic electroluminescent while light source, preferably having a device structure as follows:
substrate/ITO/NPB/NPB:Rubrene/BAlq:TBPe/Alq$_3$/LiF/Al.

FIG. 6 shows the schematic diagrams of a procedure for making the light source of the present example, in which the procedure comprises the following steps:

1) Cleaning and drying a transparent glass substrate, and sputtering a transparent conductive film ITO thereon as anodes of the device, in which the ITO has a square resistance of 5Ω and a film thickness of 100.00 nm;

2) Placing the above cleaned and dried ITO glass into a vacuum chamber having a pressure of $1\times10^{-5}$Pa, vapor depositing on the ITO film a layer of N,N'-bis-(1-naphthyl)-N,N'-biphenyl-(1,1'-diphenyl)-4,4'-diamine (NPB), having a thickness of 100 nm, as the hole transport layer of the device;

3) Keeping the above vacuum pressure, vapor depositing on the hole transport layer a electroluminescent layer, in which the main material is NPB, the dopant is 5,6,11,12-tetraphenylnaphthacene (Rubrene), and doping is performed by vapor deposition using double sources, i.e., NPB and Rubrene are separately placed in different vaporization sources, and the proportion of the doped Rubrene is regulated at 3% by controlling the evaporation rates of two vaporization sources to prepare a yellow light emission layer having a thickness of 20 nm;

4) Preparing a blue light emission layer by using the same method of 3), in which the proportion of the doped TBPe is 5%, and the thickness of the blue light emission layer is 20 nm;

5) Keeping the above vacuum pressure, continuously vapor depositing on the blue light emission layer a 30 nm Alq$_3$ electron transport layer;

6) Keeping the above vacuum pressure, continuously vapor depositing on the electron transport layer a LiF/Al cathode layer, in which the LiF layer has a thickness of 0.5 nm and the Al layer has a thickness of 150 nm.

Figure 6A:
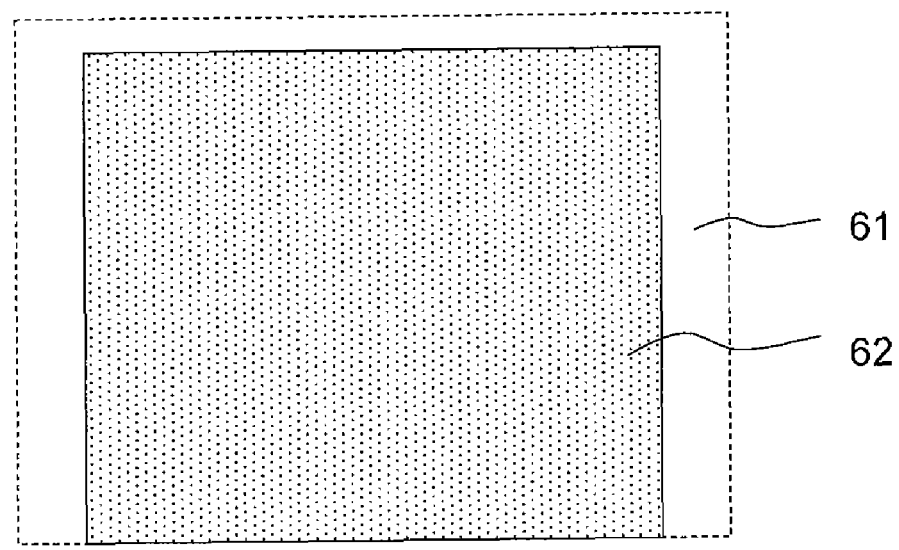
Figure 6B:
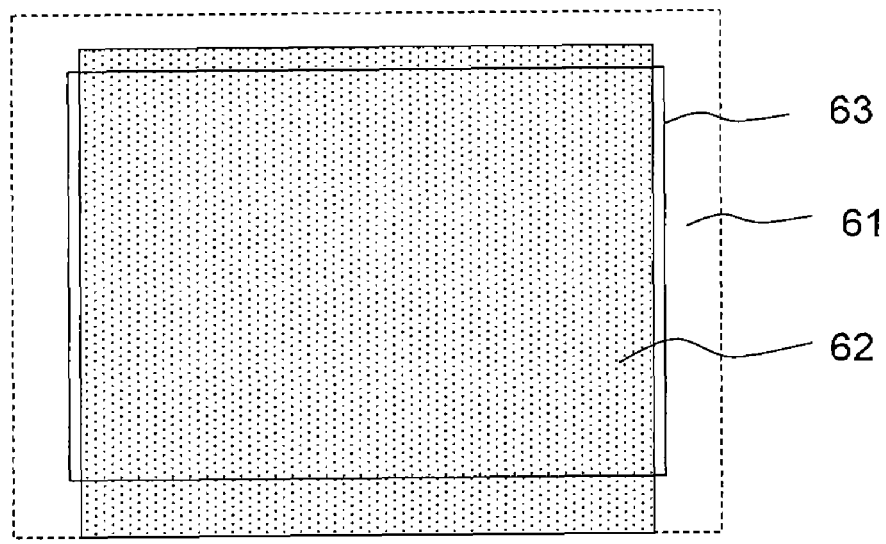

FIGS. 6(a), (b) and (c) separately are schematic diagrams of procedures for preparing the anodes, organic functional layer and cathodes of the organic electroluminescent light source of Example 3, in which 61 is substrate, 62 is anode layer, 63 is organic layer, and 64 is cathode layer.

Figure 6C:
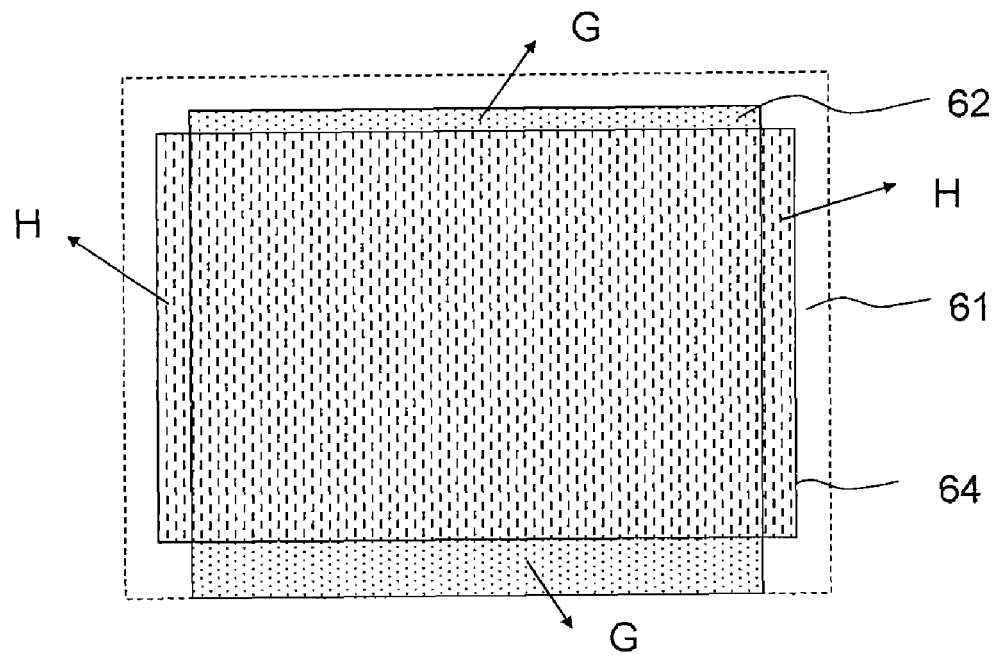
Figure 6D:
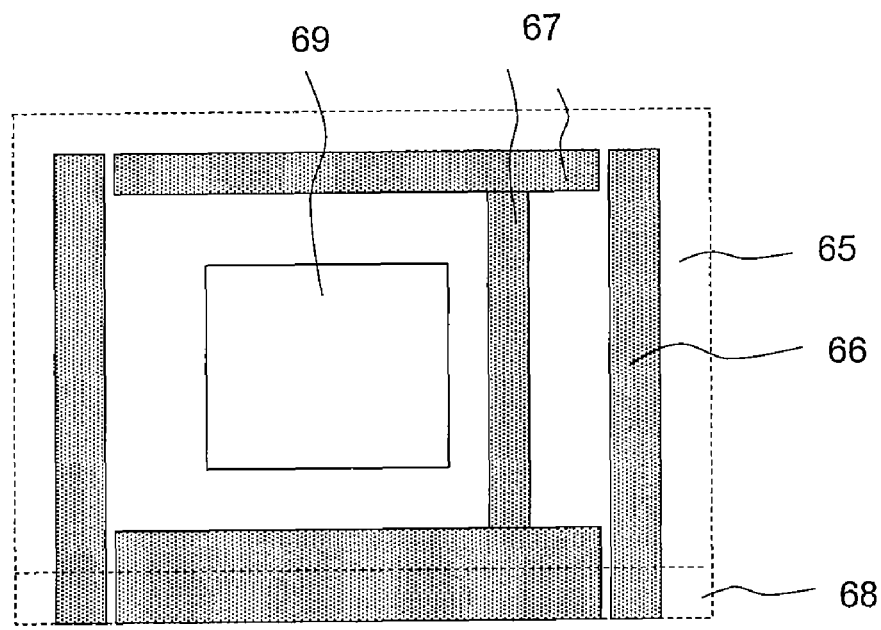

FIG. 6(d) is a schematic diagram of procedure for preparing the packaging sheet of Example 3, in which the packaging sheet is made of glass, plastic or quartz. In the present example, glass is used to make the packaging sheet, and preferably a glass plate having a thickness of 0.5~1.1 nm is selected. The dimension of the glass plate is greater than that of the substrate, a bonding region is reserved, electrode leads are prepared on the surface of the glass plate by sputtering or vapor depositing metal layers, the electrode leads include cathode leads and anode leads, in which cathode leads 66 are symmetrically disposed at two ends of the packaging sheet 65 to form two regions, and anode leads 67 are disposed at another two ends of the packaging sheet 65 to form another two regions. In addition, the anode leads region does not contact with the cathode leads region, the cathode leads region 66 and the anode leads region 67 can be of strip shape or any other shape for facilitating the electrical connection with the electrodes on the substrate 61, in which metal layers can be of a highly conductive metal such as Ag, Al, etc. to further reducing the resistance of the electrode leads regions. In the present example, metal Ag is preferably used in vapor deposition. Since the present example uses a single-sided bonding for reducing frame size and simplifying operation, two anode lead regions should be connected together, and such conductive connection is implemented in the present example by vapor deposition of conductive metal layers of strip shape between the two anode leads regions 76, in which the metal layers are also made of highly conductive metal Ag or Al, and the metal layers can also be considered as parts of the anode leads regions, as shown in FIG. 6(d). Subsequently, an insulating layer is formed by vapor deposition on the metal layers of strip shape to avoid electric connection between the metal layers and the cathodes after the packaging sheet is joined to the cathodes. The bonding region 68 is disposed at one end of the packaging sheet.

Figure 6E:
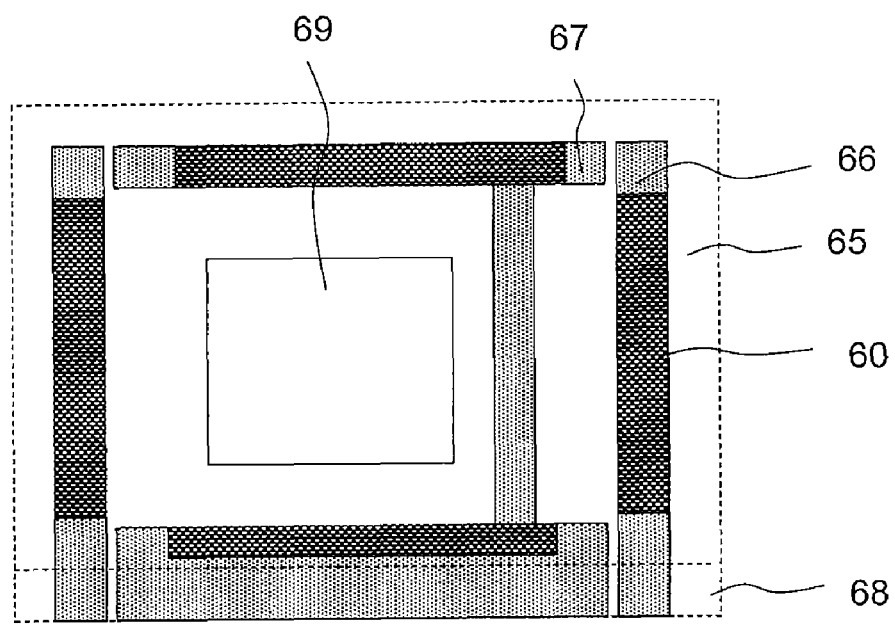
Figure 6F:
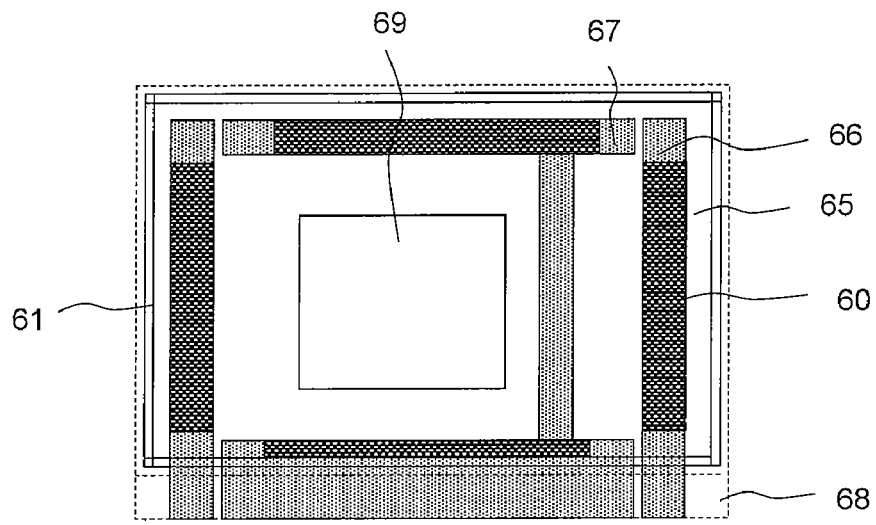

A recess is formed at the middle part of surface of the packaging sheet 65 by sandblasting or etching method for placing drying agent 69. Thus, the preparation of the packaging sheet is completed. Subsequently, a conductive adhesive 60 is coated on the four electrode leads regions that are symmetrically disposed on the packaging sheet 65, as shown in FIG. 6(e); a curable packaging adhesive 70 is coated at edges of the packaging sheet 65, as shown in FIG. 6(f). Then the above prepared electroluminescent devices are joined and packaged, the anode leads region 67 and the cathode leads region 66 on the packaging sheet 65 coated with a conductive packaging adhesive 60 are aligned to respectively the two-ends region G of anodes and two-ends region H of cathode (as shown in FIG. 6(c)), and the curable packaging adhesive 70 is aligned to the corresponding edge parts of the substrate, and then the substrate 61 and the packaging sheet 65 are closely joined under a certain pressure to implement the transfer and packaging of the electrode leads regions; or the conductive packaging adhesive is directly applied to the electrode leads regions of the packaging sheet 65 to implement the transfer of the electrode leads regions and the packaging simultaneously, in which the conductive packaging adhesive can be formed by adding conductive particles of metal Ni, Au, Au-on-Ni, Ag and Sn alloy, and thus the preparation is much simplified.

Figure 6G:
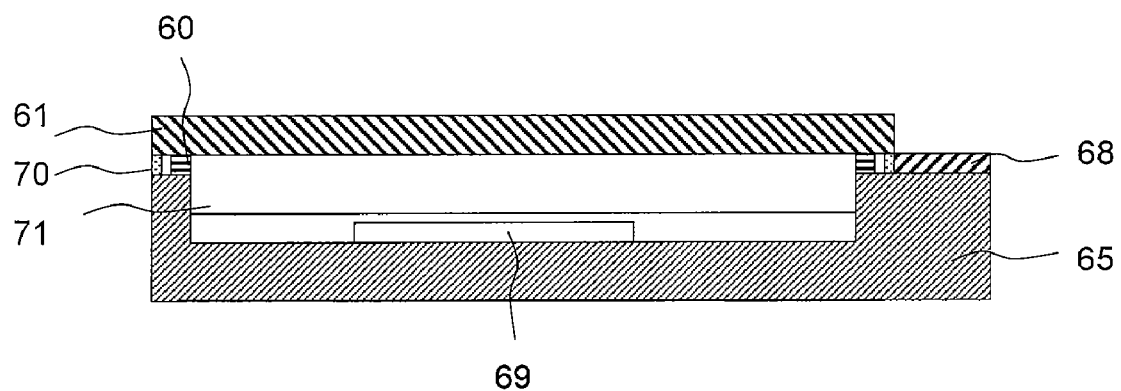

After completing the above preparation, the packaging sheet 65 is connected with a control circuit through the leads bonding region 68 at one end of the packaging sheet 65 in order to drive the light source for normal luminescence. FIG. 6(g) is a structural section diagram of the organic electroluminescent light source of the present example, which clearly indicates the connection relationship of various members of the device, in which the light emission device 71 comprises anodes, an organic functional layer and cathodes.

Since there are not leads region and bonding region disposed on the substrate in the present example, and anode leads and cathode leads are symmetrically disposed on the packaging sheet, the current difference at different points in the luminescent region is significantly reduced, and the use of low resistance metal Ag as metal layers in the electrode leads region further reduces the resistance, so that the luminescent uniformity in the luminescent region is improved, the size of frame of non-luminescent region is reduced, and the area of the luminescent region increases.

EXAMPLE 4

Figure 7:
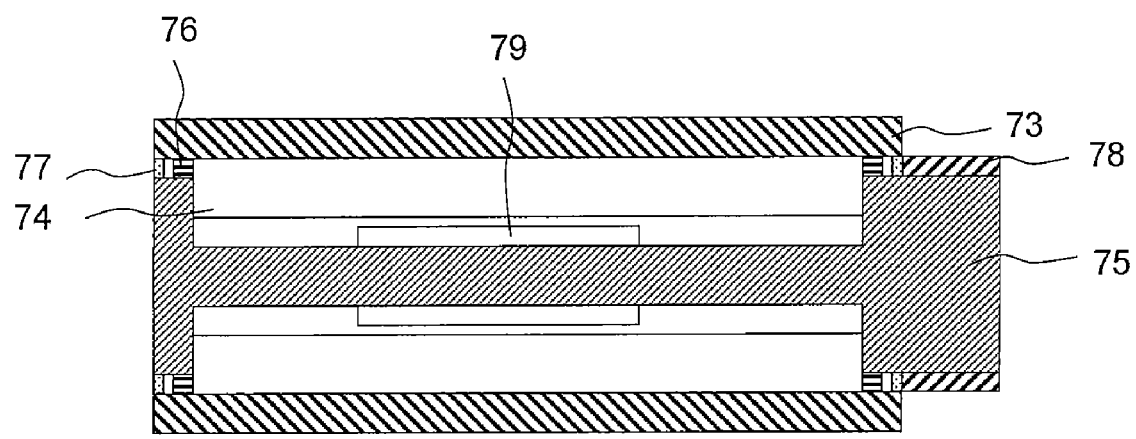
FIG. 7 is a structural section diagram of the double-sided organic electroluminescent light source of Light Source Example 2.

FIG. 7 is a structural section diagram of a double-sided organic electroluminescent light source of the present invention. In the present example, the double-sided organic electroluminescent light source comprises a first electroluminescent light source, a second electroluminescent light source and a packaging sheet sandwiched between the two electroluminescent light sources, in which the first electroluminescent light source comprises a substrate 73, a first light emission component 74, and the second electroluminescent light source similarly comprises a substrate and a second light emission component. The two surfaces of the packaging sheet 75 are electrically connected with the two light emission components, respectively. The electrode leads region of one surface of the packaging sheet 75 is electrically connected with the electrodes of the first substrate through a conductive adhesive 76 and is joined to the first substrate through the packaging adhesive 77 to implement the packaging of the first electroluminescent light source. The joining and packaging of the second electroluminescent light source are performed in the same manner as that for the first electroluminescent light source. A recess is formed at each of the upper and lower surfaces of the packaging sheet 75 for placing a drying agent 79, and a bonding region 78 is disposed at the same one end of the upper and lower surfaces of the packaging sheet 75. In addition, the first and second light emission components separately comprises anodes, an organic functional layer, cathodes disposed in order on substrate, in which the organic functional layer further comprises one or more of hole injection layer, hole transport layer, electron transport layer and electron injection layer (their specific structure are not shown in the structure diagram).

In the present example, the double-sided organic electroluminescent light source is a white light source, preferably having a structure as follows:

substrate/NPB/NPB:C545T/CBP:TBPe/CBP:Rubrene/Alq$_3$/LiF/Al.

The preparation of the present example is also identical to that of Example 3. According to the method of Example 3, the first and second electroluminescent light sources are prepared, then the packaging sheet is made, subsequently the transfer of electrode leads and the packaging of device are completed, in which both the first and second electroluminescent light sources are of bottom luminescent. In the present example, LiF/Al is preferably used as cathode, the packaging sheet is preferably of glass. In the present example, both the first and second electroluminescent light sources are bonded at the same one end of the packaging sheet in order to reduce the volume of whole device, but they may also be bonded at two ends of the packaging sheet. The packaging sheet is joined to the substrate in the same manner as Example 1, in which the two surfaces of the packaging sheet are separately joined to the two substrates. After the preparation is completed, the bonding regions of the two surfaces of the packaging sheet are separately connected with two independent control circuits to drive the first and second electroluminescent light sources for normal working.

In the present example, besides the packaging sheet servers as a supporter for the two electroluminescent light sources of the double-sided electroluminescent light source, packages the devices, and provides spaces for drying agent and heart emission, there is a further important function of the packaging sheet to provide leads region and bonding region for leads in order to implement the circuit connection of the light emission components. Due to the specific design of packaging sheet and selection of materials in the present example, the luminescent uniformity of the light source is significantly improved, the size of frame of the luminescent region is reduced, the luminescent area is extended, the two electroluminescent devices share the same one packaging sheet, the operation is simple and convenient, and the electrode leads are protected from effects of air, water and oxygen.

The invention claimed is:

1. An organic electroluminescent display, comprising a substrate, a set of anodes, an organic functional layer, a set of cathodes and a packaging sheet, wherein a set of electrode leads are disposed on a surface of the packaging sheet adjacent to the substrate for electrical connection with a control circuit of the display, and the set of electrode leads comprise a set of anode leads and a set of cathode leads which are electrically connected with the corresponding set of anodes and set of cathodes disposed on the substrate, respectively; and wherein an electric connection between the set of anodes and the set of anode leads and an electric connection between the set of cathodes and the set of cathode leads are respectively established through a set of electrically conductive media between the substrate and the packaging sheet at a position where the substrate joins the packaging sheet.

2. The organic electroluminescent display according to claim 1, wherein an electrode lead transferring region is arranged on the substrate, and the set of anode leads and the set of cathode leads on the packaging sheet are electrically connected with the set of anodes and set of cathodes respectively, which are disposed on the electrode lead transferring region.

3. The organic electroluminescent display according to claim 1, wherein an electrode lead bonding region is arranged at one end of the packaging sheet, and the control circuit of the display is electrically connected with the set of electrode leads located in the electrode lead bonding region.

4. A double-sided organic electroluminescent display, comprising
a first display device,
a second display device and
a packaging sheet sandwiched between the first display device and the second display device, in which the first display device comprises
a first substrate,
a first set of anodes,
a first organic functional layer and
a first set of cathodes, the second display device comprises
a second substrate,
a second set of anodes,
a second organic functional layer and
a second set of cathodes, and the packaging sheet as a support for the first display device and the second display device is located between the first set of cathodes and the second set of cathodes,
wherein a first set of electrode leads is disposed on a first surface of the packaging sheet adjacent to the first substrate for electrical connection with a control circuit of the first display device, and the first set of electrode leads comprises a first set of anode leads and a first set of cathode leads which are electrically connected with the first set of anodes and the first set of cathodes on the first substrate, respectively;

wherein a second set of electrode leads are disposed on a second surface of the packaging sheet adjacent to the second substrate for electrical connection with a control circuit of the second display device, and the second set of electrode leads comprises a second set of anode leads and a second set of cathode leads which are electrically connected with the second set of anodes and the second set of cathodes disposed on the second substrate, respectively; and wherein an electric connection between the corresponding anodes and anode leads and an electric connection between the corresponding cathodes and cathode leads are respectively established through a set of electrically conductive media between the first substrate and the first surface of the packaging sheet at a position where the first substrate joins to the first surface of the packaging sheet as well as a set of electrically conductive media between the second substrate and the second surface of the packaging sheet at a position where the second substrate joins to the second surface of the packaging sheet.

5. The double-sided organic electroluminescent display according to claim 4, wherein a first electrode lead transferring region and a second electrode lead transferring region are respectively arranged on the first substrate and the second substrate, the first set of anode leads and the first set of cathode leads on the first surface of the packaging sheet are electrically connected with the first set of anodes and the first set of cathodes in the first electrode lead transferring region, respectively; and the second set of anode leads and the second set of cathode leads on the second surface of the packaging sheet are electrically connected with the second set of anodes and the second set of cathodes in the second electrode lead transferring region, respectively.

6. The double-sided organic electroluminescent display according to claim 4, wherein a first electrode lead bonding region is arranged at one end of the first surface of the packaging sheet, and the control circuit of the first display device is electrically connected with the electrode leads located in the first electrode lead bonding region; and a second electrode lead bonding region is arranged at one end of the second surface of the packaging sheet, and the control circuit of the second display device is electrically connected with the electrode leads located in the second electrode lead bonding region.

7. An organic electroluminescent light source, comprising
a substrate,
a set of anodes,
an organic functional layer,
a set of cathodes and
a packaging sheet,
wherein a set of electrode leads are disposed on a surface of the packaging sheet, adjacent to the substrate for electrical connection with a control circuit of the light source, and the electrode leads comprise a set of anode leads and a set of cathode leads which are electrically connected with the corresponding anodes and cathodes disposed on the substrate, respectively; and wherein an electric connection between the set of anodes and the set of anode leads and an electric connection between the set of cathodes and the set of cathode leads are respectively established through a set of electrically conductive media between the substrate and the packaging sheet at a position where the substrate joins to the packaging sheet.

8. The organic electroluminescent light source according to claim 7, wherein the anode leads are symmetrically disposed at two ends of the packaging sheet, and the cathode leads are symmetrically disposed at another two ends of the packaging sheet.

9. The organic electroluminescent light source according to claim 7, wherein the anode leads and the cathode leads are continuous metal layers formed respectively by vapor deposition on the packaging sheet.

10. The organic electroluminescent light source according to claim 9, wherein both the continuous metal layers as the anode leads and the continuous metal layers as the cathode leads are of symmetrical strip shape.

11. The organic electroluminescent light source according to claim 7, wherein an electrical connection between the symmetrically disposed anode leads is established though metal layers of strip shape.

12. The organic electroluminescent light source according to claim 11, wherein an insulating layer is formed by vapor deposition on the metal layers of strip shape between the anode leads in order to avoid electric contact between the metal layers and the cathodes after the packaging sheet is bonded to the cathodes.

13. A double-sided organic electroluminescent light source, comprising
a first light source,
a second light source and
a packaging sheet sandwiched between the first light source and the second light source, in which the first light source comprises
a first substrate,
a first set of anodes,
a first organic functional layer and
a first set of cathodes,
the second light source comprises
a second substrate,
a second set of anodes,
a second organic functional layer and
a second set of cathodes, and
the packaging sheet as a support for the first light source and the second light source is located between the first set of cathodes and the second set of cathodes,
wherein a first set of anode leads and a first set of cathode leads are disposed on a first surface of the packaging sheet adjacent to the first substrate for electrical connection with a control circuit of the first light source, the first set of anode leads are electrically connected with the first set of anodes, and the first set of cathode leads are electrically connected with the first set of cathodes;
a second set of anode leads and a second set of cathode leads are disposed on a second surface of the packaging sheet adjacent to the first substrate for electrical connection with a control circuit of the second light source, the second set of anode leads are electrically connected with the second set of anodes, and the second set of cathode leads are electrically connected with the second set of cathodes; and wherein an electric connection between the corresponding anodes and anode leads and an electric connection between the corresponding cathodes and cathode leads are respectively established through a set of electrically conductive media between the first substrate and the first surface of the packaging sheet at a position where the first substrate joins to the first surface of the packaging sheet as well as a set of electrically conductive media between the second substrate and the second surface of the packaging sheet at a position where the second substrate joins to the second surface of the packaging sheet.

14. The double-sided organic electroluminescent light source according to claim 13, wherein the first anode leads are symmetrically disposed at two ends of the first surface of the packaging sheet, and the first cathode leads are symmetrically disposed at another two ends of the first surface of the packaging sheet; and the second anode leads are symmetrically disposed at two ends of the second surface of the packaging sheet, and the second cathode leads are symmetrically disposed at another two ends of the second surface of the packaging sheet.

15. The double-sided organic electroluminescent light source according to claim 13, wherein the first and second sets of anode leads and the first and second sets of cathode leads are continuous metal layers formed by vapor deposition on the first and second surfaces of the packaging sheet, respectively.

16. The double-sided organic electroluminescent light source according to claim 15, wherein both the continuous metal layers as the first and second sets of anode leads and the continuous metal layers as the first and second sets of cathode leads are of symmetrical strip shape.

17. The double-sided organic electroluminescent light source according to claim 14, wherein an electrical connection between the symmetrically disposed first set of anode leads is established though metal layers of strip shape; and an electrical connection between the symmetrically disposed second set of anode leads is established though metal layers of strip shape.

18. The double-sided organic electroluminescent light source according to claim 15, wherein an insulating layer is formed by vapor deposition on the metal layers of strip shape between the first set of anode leads and an insulating layer is formed by vapor deposition on the metal layers of strip shape between the second set of anode leads in order to avoid the electric contact between the metal layers and the first and second sets of cathodes after the packaging sheet is bonded to the first and second sets of cathodes.

* * * * *